US006229325B1

(12) United States Patent
Browning et al.

(10) Patent No.: US 6,229,325 B1
(45) Date of Patent: May 8, 2001

(54) METHOD AND APPARATUS FOR BURN-IN AND TEST OF FIELD EMISSION DISPLAYS

(75) Inventors: Jim Browning; Zhongyi Xia, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/258,265

(22) Filed: Feb. 26, 1999

(51) Int. Cl.$^7$ ..................................................... G01R 31/00
(52) U.S. Cl. ....................... 324/760; 324/761; 324/158.1; 445/63; 445/62
(58) Field of Search .................................... 324/760, 761, 324/754, 158.1; 315/169.1, 169.2; 348/180, 189; 345/185; 445/63, 62, 6, 3

(56) References Cited

U.S. PATENT DOCUMENTS

| 5,151,061 | 9/1992 | Sandhu . |
| 5,186,670 | 2/1993 | Doan et al. . |
| 5,205,770 | 4/1993 | Lowrey et al. . |
| 5,210,472 | 5/1993 | Casper et al. . |
| 5,232,549 | 8/1993 | Cathey et al. . |
| 5,232,875 | 8/1993 | Tuttle et al. . |
| 5,330,879 | 7/1994 | Dennison . |
| 5,358,908 | 10/1994 | Reinberg et al. . |
| 5,372,973 | 12/1994 | Doan et al. . |
| 5,391,259 | 2/1995 | Cathey et al. . |
| 5,438,259 | 8/1995 | Orihashi et al. . |
| 5,484,314 | 1/1996 | Farnworth . |
| 5,486,126 | 1/1996 | Cathey et al. . |
| 5,880,592 | * 3/1999 | Sharpes et al. ...................... 324/760 |
| 5,940,052 | * 8/1999 | Xia et al. ............................... 345/74 |
| 5,966,021 | * 10/1999 | Eliashberg et al. .................. 324/760 |
| 6,057,698 | * 5/2000 | Heo et al. ............................ 324/765 |

* cited by examiner

Primary Examiner—Safet Metjahic
Assistant Examiner—Jimmy Nguyen
(74) Attorney, Agent, or Firm—Nixon & Vanderhye P.C.

(57) ABSTRACT

A method and apparatus which provides for continual monitoring of the electrical and optical performance of one or more field emission display devices while the devices are burned-in is for the purpose of proper aging and testing of screen phosphors and semiconductor circuitry as well as determining the failure of the display devices including failures of individual field emitters within a display device. Display performance parameters including luminance anode current and field emitter performance are measured for determining when the components are properly aged as well as determining catastrophic failures in a display or a substantial degrade in performance in order to determine when and how the device may have failed.

38 Claims, 6 Drawing Sheets

METHOD AND APPARATUS FOR BURN-IN AND TEST OF FIELD EMISSION DISPLAYS

STATEMENT AS TO GOVERNMENT RIGHTS

This invention was made with government support under Contract No. DABT 63-93-C-0025 awarded by Advanced Research Projects Agency (ARPA). The government has certain rights in this invention.

FIELD OF THE INVENTION

The present invention relates to field emission displays. More particularly the invention relates to monitoring of electrical and optical performance of one or more field emission display devices during burn-in of the devices.

BACKGROUND OF THE INVENTION

The present invention relates to a method and apparatus for monitoring the electrical and optical performance of one or more field emission display (FED) devices during a burn-in period. More specifically the video driver circuitry, the field emission tips and the phosphor screen of such devices all require testing and burn-in prior to sale for the purpose of obtaining proper steady state operation, detecting faults in parts which may fail prematurely and for diagnostic purposes.

Known techniques in the manufacture of semiconductor devices involve the burning in of such devices in order to accelerate the failure of those devices having defects. Such testing is conventionally performed at elevated temperatures.

Additionally, image display devices such as cathode ray tubes, although known to have good characteristics with respect to color, brightness, contrast and resolution, use phosphors which generally degrade in performance upon initial use under prolonged cathode ray excitation. Thus, the phosphors are generally aged until stable luminance conditions are obtained along with a uniform screen appearance. Although cathode ray tube technology has been applied in various applications including desktop computer screens with good results, such devices are bulky and consume relatively large amounts of power.

More recently flat panel displays have become increasingly important in a variety of applications where lightweight portable screens with good display characteristics are required. One type of flat panel display device which is well suited for such applications is the thin film field emission display device. Such flat panel displays seek to combine the cathodoluminescent-phosphor technology of cathode ray tubes with integrated circuit technology to obtain thin high resolution displays wherein each pixel is activated by its own electron emitter or set of emitters. Such field emission displays in elementary form include a generally planar substrate having an array of integral projecting emitters which are typically conical projections grouped into emitter sets. Depending upon the size and type of display, a conductive extraction grid is positioned above the emitters and driven at a positive voltage with the emitters selectively activated by providing a current path to ground with appropriate voltage differential between the emitters and extraction grid. The resulting electric field extracts electrons from the emitters. Moreover, the field emission display device additionally includes a display screen-anode formed from a glass plate coated with a transparent conductive material forming a relatively high positive voltage differential with respect to the cathode emitters. The display screen additionally includes a cathodoluminescent layer covering the conductive anode surface whereby emitted electrons are attracted by the anode and strike the phosphor layer to thus cause the emission of light at the impact site which in turn passes through the anode and glass plate.

The luminescent level of the produced light is dependent upon the magnitude of the current flow to the emitters which is selectively controlled to produce a desired image. Field emission devices and various manners of driving circuits for use therein are known in the art, examples of which are found in commonly assigned U.S. Pat. No. 5,357,172 issued Oct. 18, 1994 to Lee et al, U.S. Pat. No. 5,387,844 issued Feb. 7, 1995 to Browning and U.S. Pat. No. 5,459,480 issued Oct. 17, 1995 to Browning et al. These patents are hereby incorporated by reference in their entirety.

In the operation of such field emission display devices there is a relatively high voltage differential generally above 200 volts between the cathode emitters and the display screen, and it is important to prevent electrical breakdown between the cathode electron emitting surface and the anode or extraction grid by maintaining an evacuated cavity between the emitters, the extraction grid and the anode. However, it is additionally desired to maintain relatively narrow spacings to obtain structurally thin flat panel displays. Moreover, since the manufacture of FEDs is relatively recent, methods and apparatus for continual monitoring of the electrical and optical performance of such displays are unknown.

Accordingly, a primary object of the present disclosure is that of providing a practical method and apparatus whereby the video driver circuitry, the field emission tips and the phosphor screen included in field emission display devices can be appropriately tested for electrical and optical performance during burn-in before the displays are sold or incorporated in a variety of applications.

BRIEF SUMMARY OF THE INVENTION

In accordance with the herein disclosed test method and apparatus, field emission display devices are loaded into an oven which is designed to allow operation of the display devices at elevated temperatures while simultaneously making measurements of relevant operating parameters of the display devices. In order to provide electrical connections for operation of the devices and testing, a plurality of such devices are electrically connected to a burn-in board by way of display carriers wherein a plurality of burn-in boards are placed in the oven for providing an interface between the displays and a control and measurement system. In this regard the oven in combination with the use of plural burn-in boards can be designed to hold hundreds of large display devices or thousands of small displays.

Once the display devices are placed in carriers, which provide appropriate sockets on the burn-in board, the preferred embodiment of the method includes placing the burn-in boards and display devices in an oven which is heated to an appropriate temperature for burn-in and testing. Thereafter, the display devices are powered up with the driver circuitry turned on and the current drawn by each display device is measured. This current is monitored to make certain that there are no failures of the driver devices. Moreover, a fuse can be placed between the power supply and the circuitry to isolate any display device drawing excessively high current due to an electrical short to thus prevent other displays in the oven from being affected by the failure of one display device. Thereafter the high voltage anode and extraction grid are energized with resistors being placed in series between the grid and its power source as well as between the high voltage anode and its power source. In this manner other display devices are protected if a failure or arc occurs by limiting the current drawn during the arc and thus preventing the failure or arcing of one display from damaging another.

Once the display devices are powered, they may be driven with video gain to cause field emission to occur. Care must be taken, however, to assure that all of the display pixels or at least one color are energized at the same level to obtain uniform aging of the phosphor screen. In this regard, the display drive is initially turned on at a low luminance level and gradually increased over many hours until the maximum luminance and anode current drive conditions are reached. In order to determine the status of the display units during burn-in, it is beneficial to measure certain display performance parameters, such as luminance, anode current and rapid grid voltage decreases.

Such measurements are used to determine the state of aging of the display screen phosphors, the driver circuit operation and field emitter failures. Moreover, the herein disclosed system and method provide clear benefits as to quality control, circuit diagnostics and reduced production costs.

DETAILED DESCRIPTION OF THE DRAWINGS

In the development of field emission displays (FEDs) from prototypes into production it has become necessary to develop new technology to enable practical burn-in and testing of such displays before they are sold and incorporated into a variety of applications. That is to say, video driver circuitry, field emission tips and the phosphor screens included in such display devices need to be burned in for proper aging and testing for the determination of faulty display devices and determination of those parts which may fail prematurely. For example, driving and control circuitry included in FEDs include semiconductor devices which require burn-in which is normally performed by running the elements at elevated temperatures such as 70° C. to 125° C. to accelerate the occurrence of any premature failures. Moreover, in FEDs electrons bombard a phosphor screen to make the phosphors luminesce. Upon initial operation the phosphor material may undergo rapid aging when first bombarded with electrons. Such aging results in a decrease in the luminance efficiency whereby patterns can be burned into the phosphor screen when first used. To eliminate this problem the phosphors can be preferentially aged in the display in a uniform manner to cause the rapid decrease in efficiency to occur and to level off to a steady state condition.

Additionally, field emission devices undergoing aging can suffer failures if the pressure in the display is too high or if the display devices include contaminating materials. To detect whether the above noted problems exist, it is desirable to operate such devices for an extended period to make certain that they will properly function and have reached a stable operating condition.

In the presently disclosed burn-in and test method, the display devices are first placed in carriers on a burn-in board for the purpose of making proper electrical contact with standard sockets on the boards. The thus loaded burn-in boards are then placed in an oven which is designed to operate the FEDs at elevated temperatures while measuring relevant operating parameters of each of the displays. Appropriate ovens can be designed to hold hundreds of large displays or thousands of small display wherein the burn-in boards, when placed in the oven, provide the interface between the display devices and a control and measurement system positioned exterior to the oven. Once the display devices and burn-in boards are in the oven, the oven temperature may be raised to between 50° C. and 125° C. for monitoring and testing of the display devices. Once the desired temperature is reached, the display devices are then powered up and sampled at designated time intervals.

Figure 1:
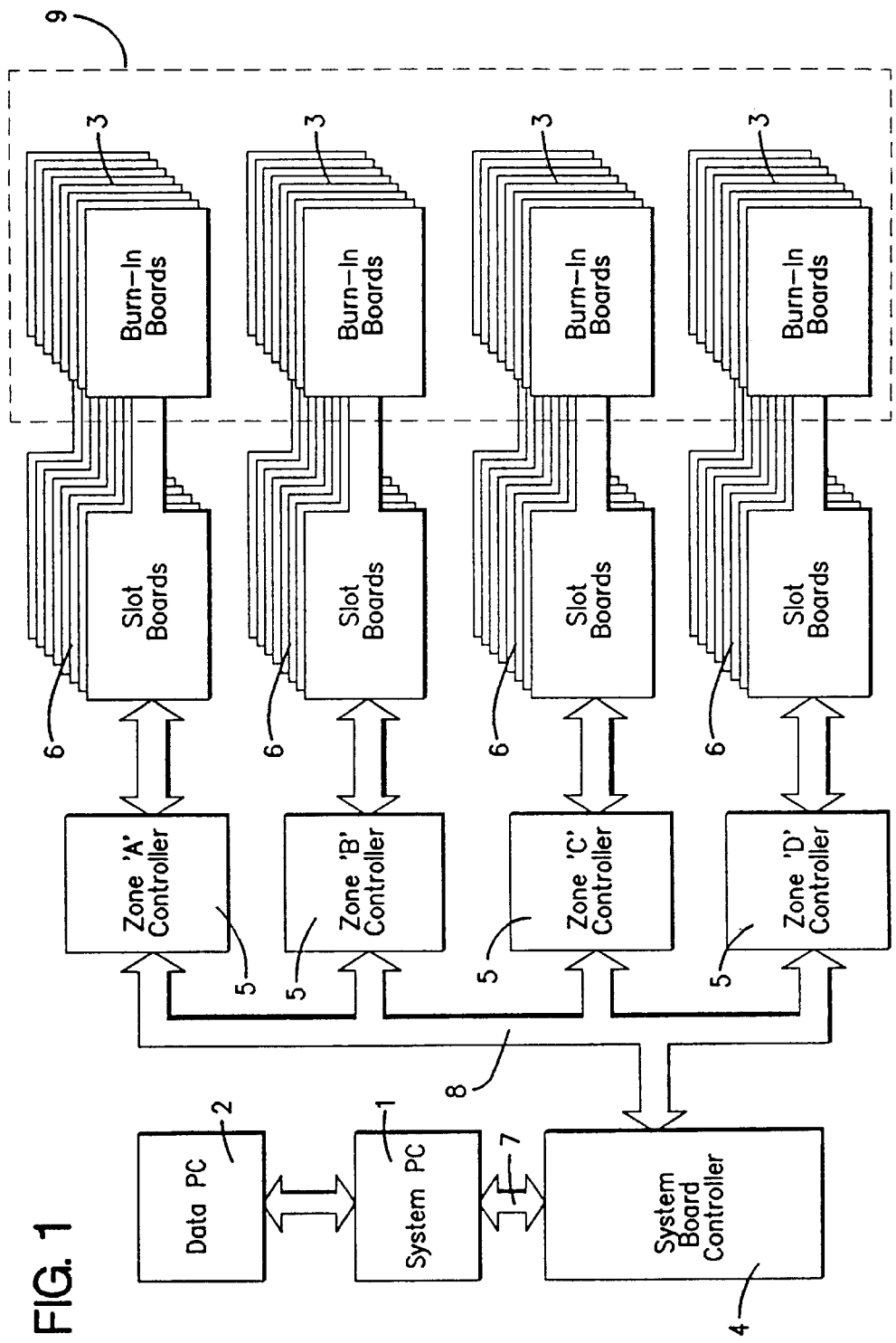
FIG. 1 is a system block diagram for performing the FED burn-in and test method.

FIG. 1 is a block diagram of an exemplary system for performing the burn-in and test method. As may be seen from the drawing, the structure includes a system PC 1 which is the main controller for the system. The primary functions of this main controller include turning on all of the required voltages in the proper order at the beginning of each burn-in cycle, as well as setting and maintaining the selected oven temperature.

Additional control functions include the sampling of display luminance, anode and grid currents at designated time intervals, as well as shutting down the system in the proper order at the end of the burn-in cycle. A data PC 2 is also included and is used for accessing measured data once the data measurements have been taken by the system PC. That is to say, the data PC enables the user to retrieve measurement data pertaining to any of the displays of the plurality of burn-in boards 3 in order to determine the status of any of the displays included on a particular board, as well as following the progress of the burn-in of individual displays in the oven 9.

A system board controller 4 is included for buffering the address bus of the system PC and for multiplexing the output signals of the zone controllers 5 to the input lines of the system PC. The system PC additionally communicates with the system board controller for the purpose of selecting which data is to be outputted and stored by the PC. The functions of each of the zone boards or controllers 5 is that of interfacing and multiplexing eight slot boards 6, for example, to the system board controller. In this regard the zone controllers communicate with the system PC by way of the system board controller using address and data bus 7 and bus 8 to provide and store the necessary stored data.

Slot boards 6 are included for several purposes such as providing an interface between each associated burn-in board 3 and the zone controller so as to provide all of the needed voltages and signals to a burn-in board for proper operation of each of the displays associated with the respective burn-in board. Such interfacing circuitry would include sync generator circuits and buffers as well as photodiode circuits for each of the displays on the associated burn-in board as well as including multiplexing circuitry for the output signals from each slot.

As previously noted, each of the burn-in boards 3, which are used for holding and making electrical connections between the boards and a plurality of FEDs, would include in an exemplary system sixty-four carriers for providing the connections. Each of the burn-in boards would additionally include next to each carrier a tank circuit and an anode current measuring circuit for operation and measurement of display data.

Figure 2:
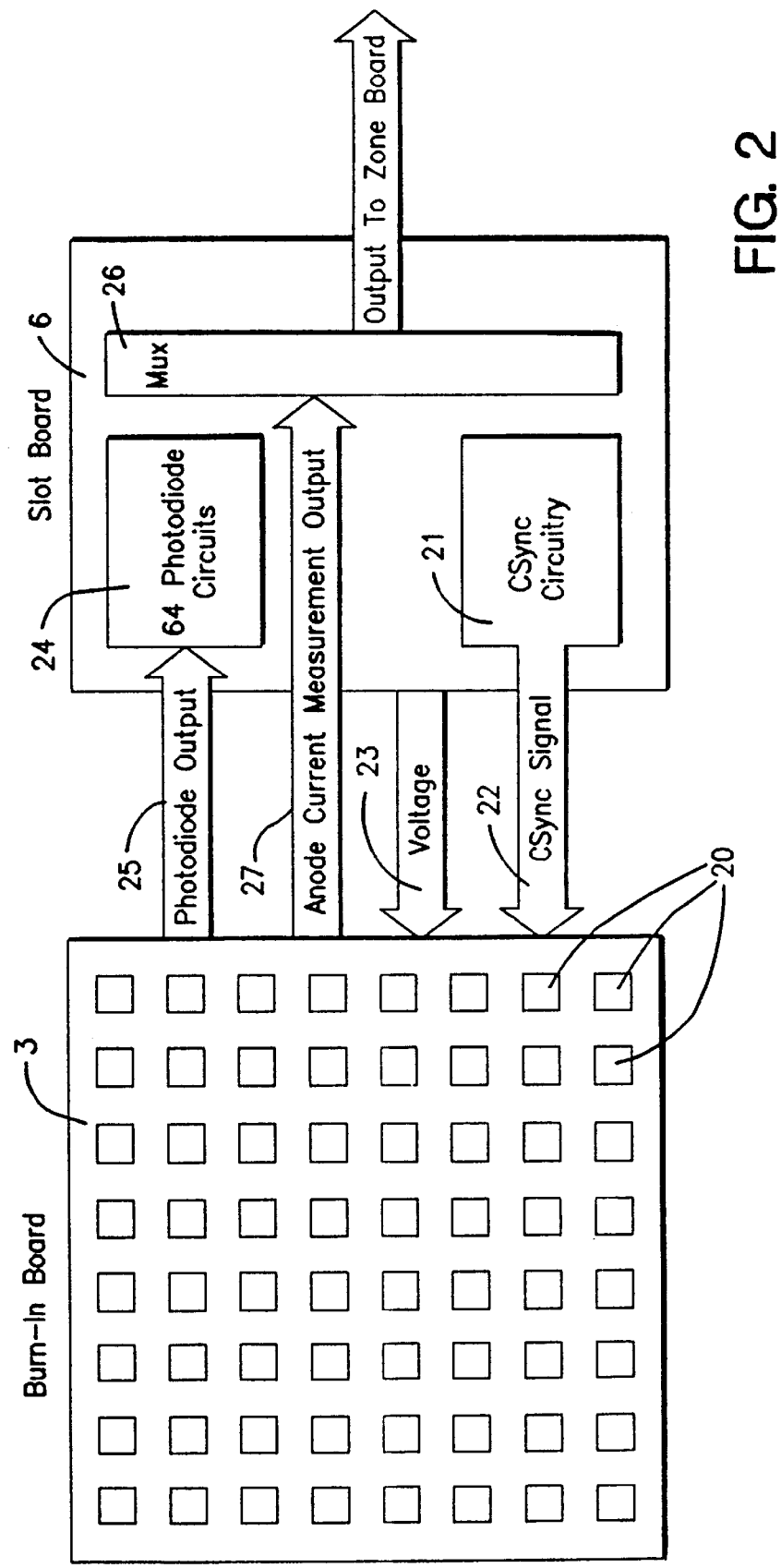
FIG. 2 illustrates in more detail the burn-in board and the slot board along with the signal flow between the boards.

In this regard FIG. 2 illustrates in more detail the elements of a single burn-in board in combination with the components illustrated in the associated slot board. The exemplary burn-in board 3 illustrated in FIG. 2 includes sixty-four carriers 20, each of which is used for holding a display device and making the electrical connections between the display and the board. Moreover, although not illustrated in FIG. 2, the board 3 may include next to each carrier a tank circuit and an anode current measuring circuit which are used during the burn-in and test process for measuring display parameters. As indicated above, a slot board 6 associated with each of the burn-in boards provides an interface between the burn-in board and a zone controller. Included in the slot board is a C sync generator circuit 21 (see, e.g., FIG. 6) including buffers for providing timing signals on bus 22 as well as operating voltages for the displays on bus 23.

A photodiode is associated with each display device on the burn-in board for the purpose of measuring the average luminance produced by a display device during its operation. By measuring the luminance variation with time it can be determined which of the phosphors are properly aged so as to obtain a stable luminance condition for the display. Photodiode circuits 24 receive the sixty-four outputs produced on bus 25 which are subsequently combined in multiplexer 26 along with the exemplary sixty-four anode current measurements produced on bus 27.

Figure 3:
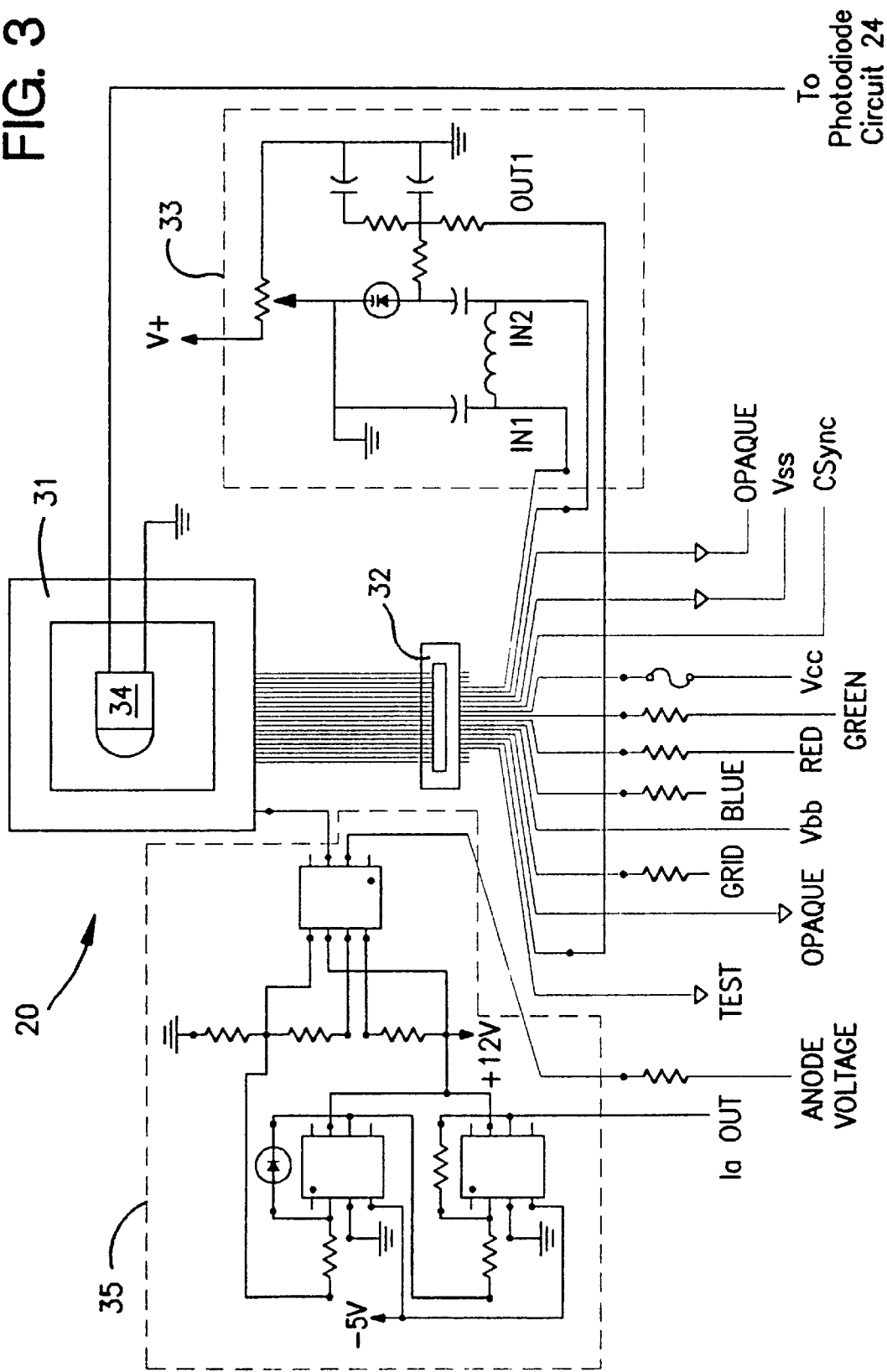
FIG. 3 illustrates the circuitry and signals for a single FED device connected by way of a carrier on the burn-in board.

A more detailed illustration of the circuitry and signals for a single display for each of the carriers 20 is shown in FIG. 3. In this regard an FED 31 may be connected by way of a standard socket 32 for connection to operating voltages and tank circuit 33. Moreover, a photodiode 34 and an anode current measuring circuit 35 may be associated with each of the displays on the burn-in board for producing appropriate measurement values output to the slot board 6 of FIG. 2, for example. The operation of tank circuit 33 and current measuring circuit 35 is readily understood in the art. Accordingly, a detailed description of the operation of these circuits is not provided here.

Additionally, as illustrated in FIG. 3 a fuse is placed in the power supply line (Vcc) whereby if the display draws a large current due to a fault such as an electrical short, the fuse will operate to isolate the FED from the power source and thus prevent other displays within the oven from being affected by the failure of one display. For further protection of the circuitry and for measuring field emitter failures, resistors are placed in the high voltage anode and display grid lines between the power supplies and the FED. In this manner if a failure such as an arc occurs, the large current drawn during the arc will be limited by the series resistors in the lines. As a result, the failure or arcing of one display is prevented from damaging another display. The size of the respective resistors will depend on the size of the FED. Typically a 10 to 100 MOhm resistor is used for the grid for the high voltage anode which may draw from 10 $\mu$A to 10 mA. The resistor should be sufficiently small so as to cause only a small voltage drop during normal operation. For small displays the resistor is typically 100 KOhms to 10 MOhm. If the size of the FED is such that the high voltage anode draws in the mA range, a fuse may be used in place of the resistor.

As an additional feature, field emitter failure in an FED can be measured by detecting a rapid decrease in the grid voltage due to grid-emitter arcing which produces positive going voltage pulses. Detection of these pulses provides a way of counting the number of failure events in the FED array under operating conditions. Succinctly stated, a capacitor is associated with the grid voltage line for AC coupling of such pulses to a measuring circuit such as a counter included in the system PC 1. Such circuitry is highly useful in determining whether any of the display emitters of an FED has failed to thus designate the problem displays that are undergoing emitter failures. Such circuitry is known in the prior art and is disclosed, for example, in the article "Measurement of Gated Field Emitter Failures" by M. Gilmore, N. E. McGreuer, J. Browning, and W. J. Bintz published in the *Review of Scientific Instruments*, 1992, which is hereby incorporated by reference in its entirety.

Figure 4:
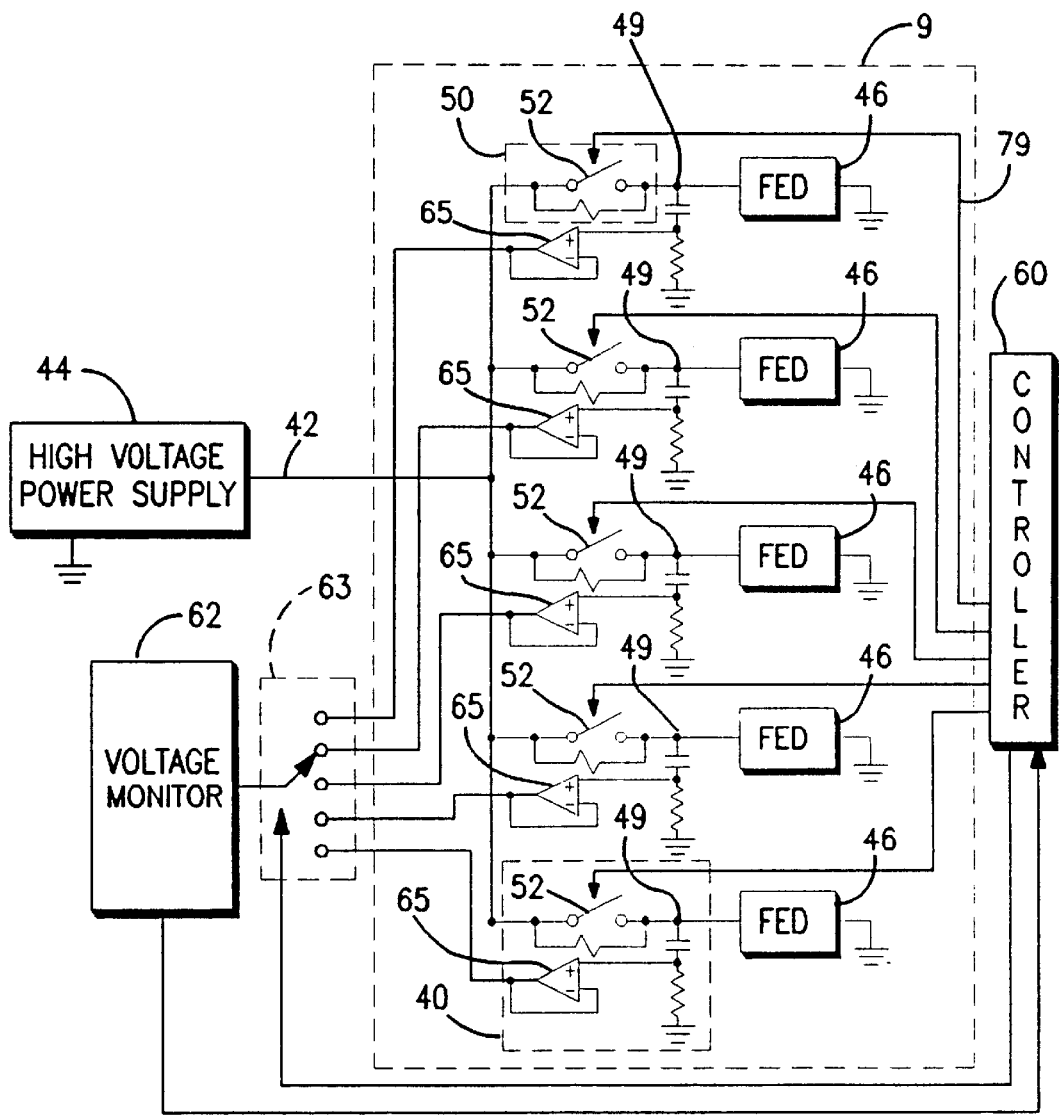
FIG. 4 is a block diagram of a current monitor for measuring the anode current of a plurality of FEDs.

FIG. 4 illustrates an alternative manner of measuring anode currents for a plurality of FEDs which is described in commonly assigned U.S. Pat. No. 5,940,052 to Xia et al, and which is hereby incorporated by reference in its entirety. In this embodiment the control functions provided by controller 60, as well as the high voltage power supply 44 would be provided to the burn-in boards by a zone controller 5 as well as receiving the output of voltage monitor 62. As explained in the referenced application, each of the field emission displays 46 is selectively coupled to the high voltage output of the power supply 44 by way of high voltage line 42 and a respective test circuit 40.

In operation, switch 52 of the FED to be tested for anode current measurement is opened to produce a voltage change at the respective output node 49 to thus produce a voltage proportional to the anode current at the voltage monitor 62 by way of a unity gain buffer 65. The output of the voltage monitor is then provided to the controller 50 for computation of the anode current flowing in the corresponding FED 46. Moreover, the controller 50 repeats the process for each FED to be tested at selected sampling intervals over the time that the displays 46 are being burned in and tested in oven 9.

Figure 5:
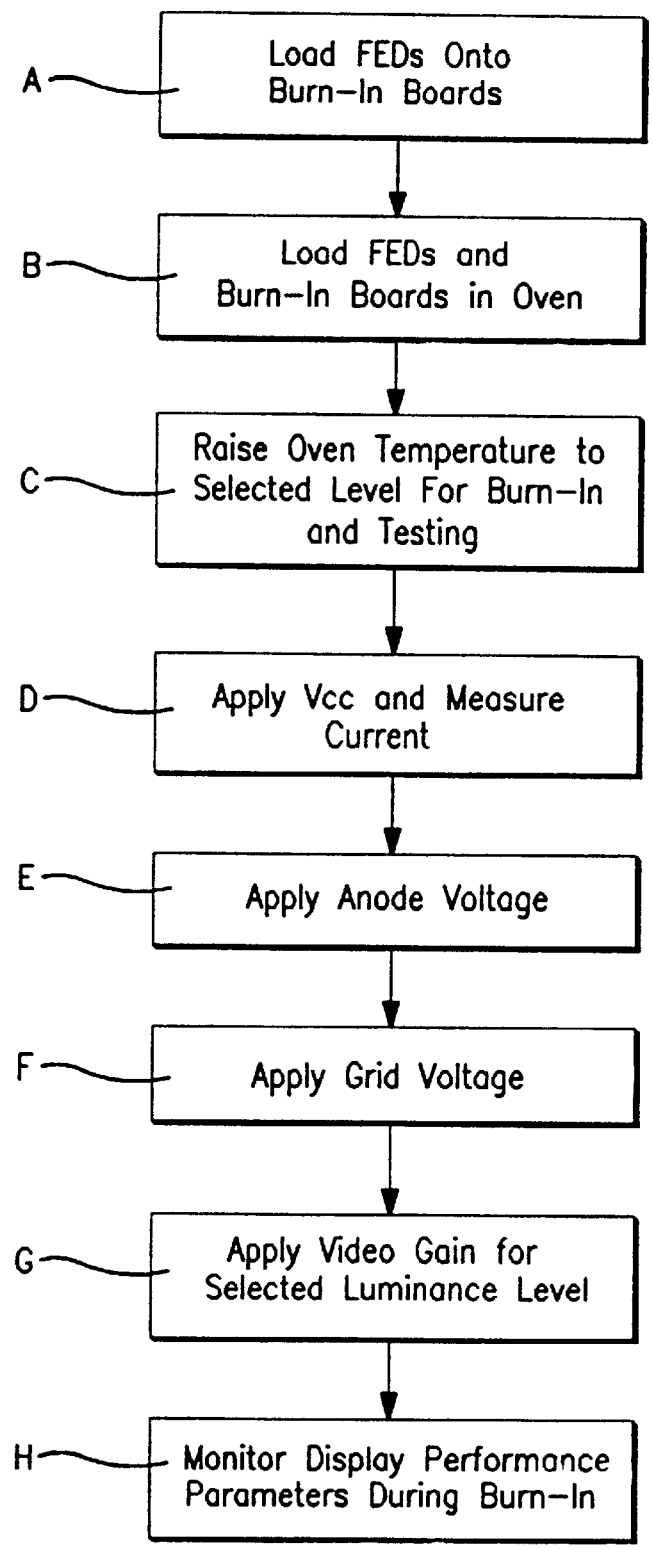
FIG. 5 is a flow diagram of the steps involved in the method for FED burn-in and testing.

FIG. 5 illustrates a flow diagram of the steps involved in the burn-in and test method. In the initial step A, a number of FEDs are placed in carriers on each of the burn-in boards to provide electrical connections to the FEDs. At step B, the burn-in boards and displays are placed in an oven 9 wherein the burn-in boards provide an interface between the displays and the control and measurement system by way of the slots boards. Thereafter, as controlled by the system PC 1 and the system board controller as indicated in step C, the temperature of the oven is raised to a selected temperature between 20° C. and 125° C. for burn-in and testing. The time period for burn-in and testing may vary considerably, for example, from 5 to 100 hours, depending upon the types of displays, the aging of one or more phosphors and whether all displays are driven simultaneously or sequentially.

Once the displays and oven are raised to an appropriate selected temperature, the displays are powered up by the application of voltage to the driver circuitry wherein the current drawn by the circuitry is measured as indicated at step D. In this regard a fuse may be placed between the power source and the circuitry for isolating a particular display exhibiting an electrical fault causing a large current to flow. Such isolation will prevent other displays in the oven from being affected by the failure of one display. Thereafter, as indicated in steps E and F, high voltage is applied to the anode along with grid voltage causing field emission. Resistors are placed in series between the display grid and its power source to protect other displays as well as the power source and the high voltage anode. With regard to the display grid, if a failure or arc occurs the large current drawn during the arc will be limited by the series resistors in the lines to thus prevent the failure or arcing of one display from damaging another. Ordinarily the grid of an FED will draw very little current; for example, less than 1 $\mu$A. However, larger displays may draw slightly more current. Similar observations may be made with regard to the anode current drawn by different size displays. Thus, the size of the resistors used will depend upon the size of the display. In this regard, a 10 MOhm to 100 MOhm resistor will typically be used for the grid. With regard to the anode, which may draw from 10 $\mu$A to 10 mA, the resistor should be sufficiently small to cause only a small voltage drop during normal operation. For small displays the resistor will typically be 100 KOhms to 10 MOhms. Additionally, where the display anode current is in the mA range, a fuse may be used in place of the resistor.

Once the display is powered, video gain may be applied to produce field emission at low initial luminance levels. In this regard all of the display pixels of an individual display device or at least one color should be turned on at the same level so that the phosphor screen is aged in a uniform manner. Moreover, the display drive will be gradually increased from an initial low luminance level up to maximum drive as to luminance and anode current for proper burn-in of the phosphors. The drive condition versus time should be determined empirically based upon the display type and size and the particular phosphors that are used. Typically the drive can reach maximum value in five to ten hours and thereafter allowed to operate at maximum luminance for periods of from five to one hundred hours depending upon the aging time of a particular phosphor, the amount of current used to accelerate the aging of the phosphor, the equilibrium time associated with the emitter tips, the gas in the display package and the failure time/temperature of the semiconductor devices involved in the displays. Although each of the displays could be individually powered up and tested, for reasons of economy and increased output, all of the displays can be simultaneously powered up and sequentially monitored during the burn-in period.

As mentioned previously, during the burn-in of the FEDs it is beneficial to measure performance parameters of each of the displays as generally indicated in step H of FIG. 5. Such parameters would include the measurement of the display luminance through the use of photodiodes 34 which are tuned to the visible spectrum so as to measure the average luminance produced by each display and thus obtain a quantitative estimate of the luminance variation with time as well as determining when the phosphor has finished its rapid aging and has obtained a stable luminance condition.

A second display performance parameter which is measured is the anode current. The anode current is important for detecting failures and for diagnostic purposes such as determining whether degradation of the display luminance is from the degrading of the phosphor or from other sources. Moreover, the anode current can also be used to determine whether there are problems with the display package due to contaminants and the like as well as to determine when the field emitters have reached an operating equilibrium condition.

A still further display performance parameter is that of determining field emitter failure by detecting rapid grid voltage decreases caused by failure of the emitters wherein such detection can be used to trigger a measuring circuit such as a counter and wherein the measurement is indicative of the number of emitter failures and problems with individual displays undergoing such emitter failures.

Figure 6:
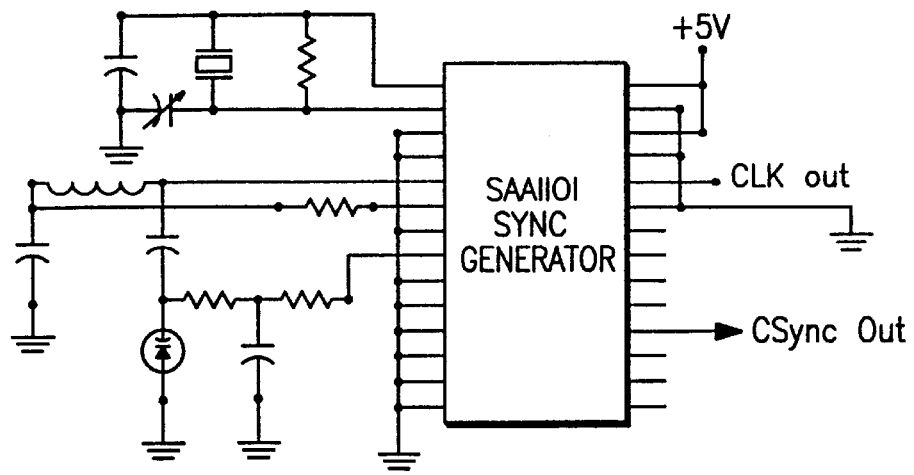
FIG. 6 is an exemplary synchronization and timing circuit.
Figure 7:
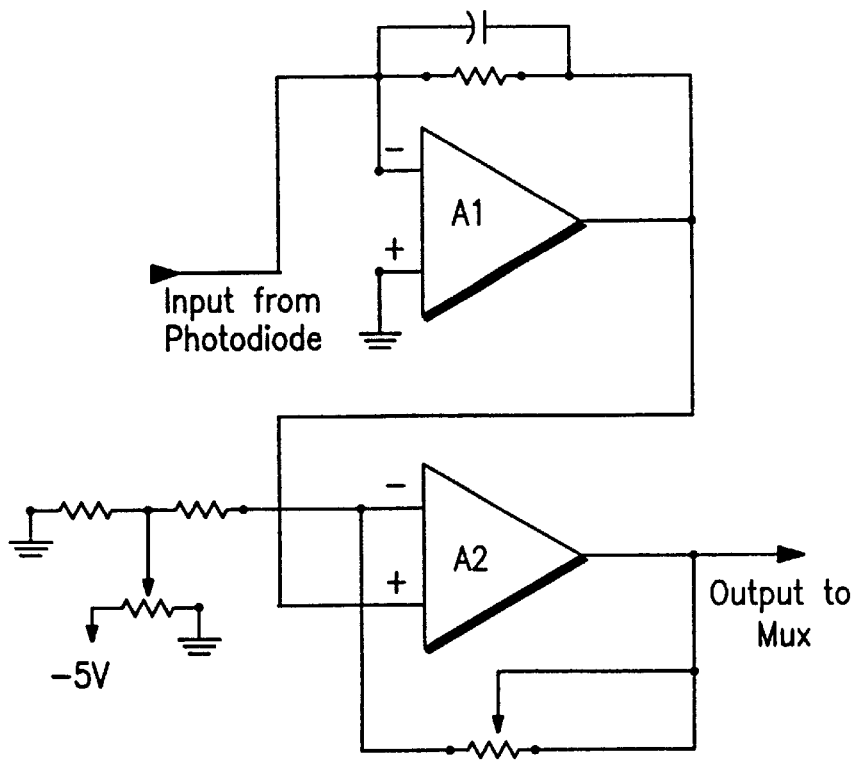
FIG. 7 is an exemplary photodiode circuit for measuring luminance of a display device.

FIGS. 6 and 7 illustrate exemplary C sync and photodiode circuits respectively. With regard to the C sync signal generating circuit, FIG. 6 illustrates a conventional sync signal circuit utilizing a commercially available Philips SAA1101 sync generator. Of course, other suitable sync generating circuits are readily within the skill of the art, and the present invention is not intended to be limited to the particular details of the sync generating circuit illustrated in FIG. 6.

The luminance measurement circuit for the photodiode is illustrated in FIG. 7. In operation, the photodiode is placed above an FED under test. When the FED is turned on, the light from the FED will induce a current flow from the photodiode to the operational amplifier circuit A1. The amplifier A1 is configured as a transimpedance amplifier which converts the current to a voltage signal. The voltage signal from amplifier A1 is further amplified by amplifier A2 to a level which is appropriate for the sampling circuit. Since the current from the photodiode is proportional to the luminance of the display, the voltage output by amplifier A2 is proportional to the luminance of the FED under test.

In the emerging field of vacuum microelectronics where field emission displays are moving from prototypes to manufacture, it is important that methods and apparatus for effective preparation of such displays by way of burn-in and testing be developed. Such burn-in and testing are essential in order to obtain lightweight portable screens having high reliability and good display characters. The present inventors are not aware of any known methods and apparatus for preparing such displays via burn-in and testing as described herein.

Although the particular process and apparatus as illustrated in the drawings and described in the present specification is fully capable of obtaining the disclosed objects and advantages, it is to be understood that the present disclosure is merely illustrative of exemplary embodiments of the invention and is intended to cover various modifications and equivalent arrangements included within the spirit and scope of the appended claims.

What is claimed is:

1. A method of burning-in and testing of field emission display devices comprising:
   loading at least one of the devices into an oven and operating the oven at an oven temperature in the range from approximately 20° C. to approximately 125° C.;
   applying an operation voltage to emitters of the at least one of the devices at said oven temperature;
   applying anode voltage to the at least one of the devices;
   applying grid voltage to the at least one of the devices;
   setting a video gain voltage at an initial low voltage value to cause substantially uniform luminance to occur for display pixels of said at least one display device;
   increasing the video gain voltage until a maximum voltage value is obtained; and
   monitoring display performance parameters including luminance and anode current values during a burn-in period while operating the at least one of the display devices at said oven temperature.

2. A method as in claim 1 wherein the performance parameters include at least one indicator of field emitter failures.

3. A method as in claim 2 wherein field emitter failures are determined by detecting rapid grid voltage decreases.

4. A method as in claim 3 wherein detecting rapid grid voltage decreases is used to trigger a counter for counting the number of field emitter failures.

5. A method as in claim 1 wherein luminance is monitored to determine when rapid aging of display screen phosphors decrease to substantially steady state luminance conditions.

6. A method as in claim 5 further including providing a photodetector on the at least one display device to measure average luminance produced by the at least one display device.

7. A method as in claim 1 further including providing a photodetector on the at least one display device to measure average luminance produced by the at least one display device.

8. A method as in claim 1 wherein the at least one display device includes a screen having tricolor phosphors and the video gain voltage is applied to at least one of the phosphors.

9. A method as in claim 8 further including providing a photodetector on the at least one display device to measure average luminance produced by the at least one display device.

10. A method as in claim 1 further including determining from the monitored anode current when field emitters of the at least one display device have reached an equilibrium operating condition.

11. A method as in claim 1 further including determining from the monitored display parameters when the at least one display device exhibits fault conditions.

12. A method as in claim 1 wherein a plurality of the devices are loaded into the oven and operated at said oven temperature, and wherein said plurality of the devices are monitored for display performance parameters.

13. A method as in claim 12 wherein the devices are operated at said oven temperature for a time period sufficient to burn-in phosphors and semiconductor elements included in the devices.

14. A method as in claim 13 wherein the operation time is in the range of 5 to 100 hours.

15. A method as in claim 12 further including the step of determining from the monitored display performance parameters whether a catastrophic failure or a substantial degrade in device performance has occurred.

16. A method as in claim 1 wherein the devices are operated at said oven temperature for a time period sufficient to burn-in phosphors and semiconductor elements included in the devices.

17. A method as in claim 16 wherein the operation time is in the range of 5 to 100 hours.

18. A method as in claim 1 further including the step of determining from the monitored display performance parameters whether a catastrophic failure or a substantial degrade in device performance has occurred.

19. A system for burning-in and testing field emission display devices comprising:
a burn-in oven for heating and operating at least one field emission device at an oven temperature in the range from approximately 20° C. to approximately 125° C.;
at least one burn-in board for holding and providing electrical connections to the at least one field emission display device;
an electrical test fixture for supplying operating voltages to the at least one field emission device via a burn-in board and for monitoring display performance parameters during a burn-in period, said display performance parameters including anode current, device operating current, grid voltage and display luminance of the at least one field emission display during the burn-in period;
a photodetector associated with the at least one field emission display device for measuring the display luminance during the burn-in period;
an anode current measuring circuit associated with the at least one field emission display device for measuring anode current during the burn-in period; and wherein
said electrical test fixture is operable to detect rapid grid voltage decreases for determining whether field emitter failures in the at least one field emission display device have occurred during the burn-in period.

20. A system as in claim 19 wherein the electrical test fixture in response to the monitored anode and device operating current detects a catastrophic failure or a substantial degrade in device performance during the burn-in period.

21. A system as in claim 19 wherein a plurality of field emission display devices are connected to each burn-in board during the burn-in period.

22. A system as in claim 21 wherein current limiting devices are included in operating voltage supply lines connected to each said field emission display device to prevent a failure in one field emission display device from effecting the operation of other field emission display devices.

23. A system as in claim 21 wherein the electrical test fixture monitors the display performance parameters of each field emission display device during the burn-in period.

24. A system as in claim 19 wherein the electrical test fixture monitors the display performance parameters of each field emission display device during the burn-in period.

25. A system as in claim 19 wherein the photodetector is a photodiode tuned to the visible spectrum for measuring the average luminance of the at least one field emission display device.

26. A system as in claim 19 wherein the electrical test fixture includes a counter responsive to the detection of rapid grid voltage decreases for counting field emitter failures.

27. A system as in claim 19 wherein the test fixture operates the at least one field emission display device at an elevated temperature for a time period sufficient to burn-in phosphors and semiconductor elements included in the at least one field emission display device.

28. A system as in claim 27 wherein burn-in time period is in the range of 5 to 100 hours.

29. A system for burning-in and testing field emission display devices comprising:
a burn-in oven for heating field emission display devices during a burn-in period;
burn-in boards for holding and providing electrical connections to the field emission display devices;
photodetectors associated with the field emission display devices for measuring the display luminances of the field emission display devices during the burn-in period;
anode current measuring circuits associated with the field emission display devices for measuring anode currents of the field emission display devices during the burn-in period; and
a main controller for controlling voltages supplied to the field emission display devices during the burn-in period, for setting and maintaining an oven temperature for the burn-in oven during the burn-in period, and for sampling the display luminance and the anode currents at designated times during the burn-in period.

30. A system as in claim 29, further comprising:
a data access device providing user access to the sampled display luminance and anode currents.

31. A system as in claim 29, wherein the main controller sets a video gain voltage at an initial low voltage value to cause substantially uniform luminance to occur for display pixels of the field emission display devices and then increases the video gain voltage until a maximum voltage value is reached.

32. A system as in claim 29, wherein the main controller maintains the oven temperature for the burn-in oven in the range from approximately 20° C. to approximately 125° C.

33. A system as in claim 29, wherein the burn-in boards are arranged in zones, each zone comprising a plurality of the burn-in boards and having an associated zone controller.

34. A system as in claim 33, further comprising:
a system controller providing an interface between the main controller and the zone controllers.

35. A system as in claim 33, further comprising:
slot boards providing interfaces between the burn-in boards and the zone controllers.

36. A system as in claim 35, wherein each slot board comprises sync generator circuits.

37. A system as in claim 35, wherein each slot board comprises photodiode circuitry that receives a photodiode output.

38. A system as in claim 35, wherein each slot board comprises multiplexing circuitry.

* * * * *